United States Patent
Chan et al.

(10) Patent No.: US 9,966,913 B2
(45) Date of Patent: May 8, 2018

(54) LINEAR-IN-DB, LOW-VOLTAGE, PROGRAMMABLE/VARIABLE GAIN AMPLIFIER (PGA) USING RECURSIVE CURRENT DIVISION

(71) Applicant: Hong Kong Applied Science and Technology Research Institute Company, Limited, Hong Kong (HK)

(72) Inventors: Chi Hong Chan, Hong Kong (HK); Bun Go Yau, Shenzhen (CN); Gordon Chung, Hong Kong (HK)

(73) Assignee: Hong Kong Applied Science and Technology Research Institute Company, Limited, Hong Kong (HK)

( * ) Notice: Subject to any disclaimer, the term of this patent is extended or adjusted under 35 U.S.C. 154(b) by 0 days. days.

(21) Appl. No.: 15/245,475

(22) Filed: Aug. 24, 2016

(65) Prior Publication Data
US 2018/0062596 A1 Mar. 1, 2018

(51) Int. Cl.
*H03F 1/36* (2006.01)
*H03G 1/00* (2006.01)
*H03F 3/45* (2006.01)

(52) U.S. Cl.
CPC ......... *H03G 1/007* (2013.01); *H03F 3/45273* (2013.01); *H03F 2203/45151* (2013.01); *H03F 2203/45154* (2013.01)

(58) Field of Classification Search
CPC ..................................................... H03G 1/007
USPC ......................................................... 330/254
See application file for complete search history.

(56) References Cited

U.S. PATENT DOCUMENTS

| 4,631,522 | A |   | 12/1986 | Cabot |
|-----------|---|---|---------|-------|
| 5,119,095 | A | * | 6/1992  | Asazawa ............... H03M 1/785 341/118 |
| 5,455,582 | A |   | 3/1995  | Valdenaire |
| 5,486,791 | A |   | 1/1996  | Spitalny et al. |
| 5,684,431 | A |   | 11/1997 | Gilbert et al. |

(Continued)

FOREIGN PATENT DOCUMENTS

CN 203984362 U 12/2014

OTHER PUBLICATIONS

ISR and Written Opinion, PCT/CN2016/097397, dated May 31, 2017.

*Primary Examiner* — Khanh V Nguyen
*Assistant Examiner* — Khiem Nguyen
(74) *Attorney, Agent, or Firm* — Stuart T. Auvinen; gPatent LLC

(57) ABSTRACT

A Programmable-Gain Amplifier (PGA) has programming steps that are linear when expressed in Decibels (linear-in-dB). A Recursive Current Division (RCD) resistor network generates currents that are selected by programmable switches to connect to a summing node input of an amplifier. A feedback resistor is connected across the summing node and the amplifier output. The resistor network has only three resistance values regardless of the number of currents selectable as programming steps. The value of a third resistor is set equal to the equivalent resistance of a second resistor in parallel with a series connection of a first resistor and the third resistors. Each final cell in the resistor network is equivalent to the third resistor, allowing recursive division of adjacent currents. The ratio of adjacent currents remains constant for all cells. Recursive Current Division (RCD) produces linear-in-dB programming steps. Floating switches are avoided since switches connect to ground.

15 Claims, 10 Drawing Sheets

(56) References Cited

U.S. PATENT DOCUMENTS

| | | |
|---|---|---|
| 6,049,252 A | 4/2000 | Iwata |
| 6,307,490 B1 | 10/2001 | Litfin et al. |
| 6,633,246 B1 | 10/2003 | Bowers |
| 8,013,672 B2 | 9/2011 | Guo et al. |
| 8,514,017 B2 * | 8/2013 | Araki ............... H03F 1/34 330/144 |
| 8,643,432 B1 | 2/2014 | Chan et al. |
| 9,112,465 B2 | 8/2015 | Dey et al. |
| 2007/0096965 A1 | 5/2007 | Gillespie et al. |

* cited by examiner

| CTRL | Gain (dB) | Gain (RF/RS) | RF (kOhm) | RS (kOhm) |
|---|---|---|---|---|
| 000 | 0 | 1.000 | 10 | 10.000 |
| 001 | 2 | 1.259 | 10 | 7.943 |
| 010 | 4 | 1.585 | 10 | 6.310 |
| 011 | 6 | 1.995 | 10 | 5.012 |
| 100 | 8 | 2.512 | 10 | 3.981 |
| 101 | 10 | 3.162 | 10 | 3.162 |
| 110 | 12 | 3.981 | 10 | 2.512 |
| 111 | 14 | 5.012 | 10 | 1.995 |

FIG. 3

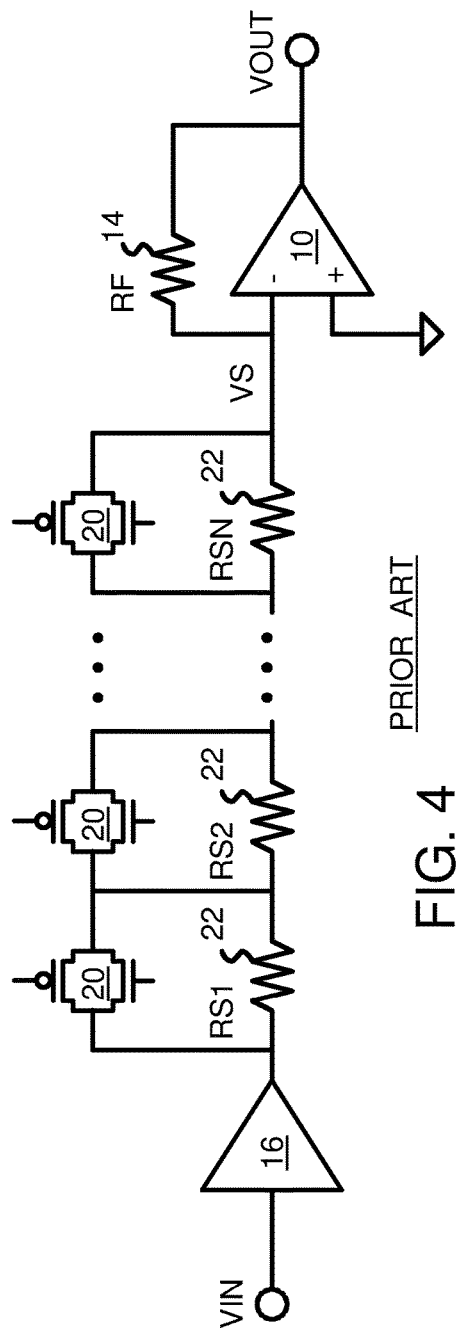
FIG. 4
PRIOR ART
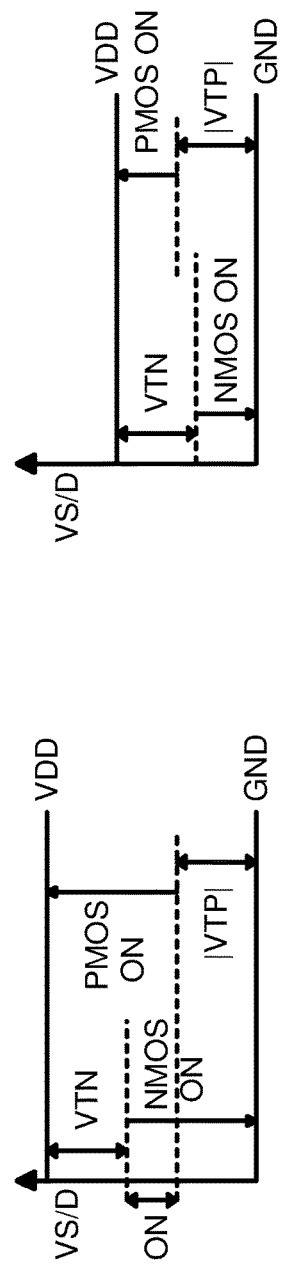
FIG. 5B
PRIOR ART
FIG. 5A
PRIOR ART

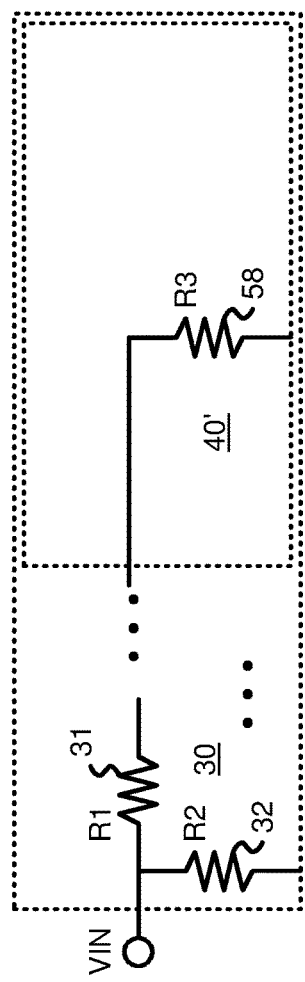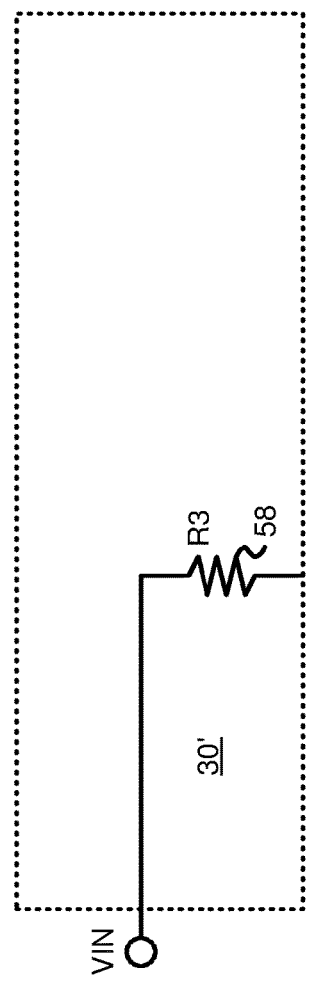
FIG. 9
FIG. 10

LINEAR-IN-DB, LOW-VOLTAGE, PROGRAMMABLE/VARIABLE GAIN AMPLIFIER (PGA) USING RECURSIVE CURRENT DIVISION

FIELD OF THE INVENTION

This invention relates to a Programmable-Gain Amplifier (PGA) and more particularly to a resistor network that performs recursive current division to achieve linear-in-Decibels programming steps.

BACKGROUND OF THE INVENTION

Analog circuits often use amplifiers such as op amps to amplify a signal. Signals may have a dynamic range that is better expressed using a logarithmic scale rather than a linear scale. A ratio of one signal to another is often expressed in Decibels (dB) to show the exponential term rather than the linear values. For example, a signal-to-noise ratio is commonly expressed in dB.

Since signal intensity or power is often caused by exponential physical responses of silicon junctions and other structures, electronic circuits that operate logarithmically rather than linearly are sometimes desired. For example, a security system may have a signal-to-jammer ratio where the jammer power is programmable in logarithmic steps, rather than in linear steps. Some measurement systems that provide time gain compensation, such as ultrasound measurement in the medical field, or radar systems, or various communications systems with automatic gain control, can benefit from logarithmically-programmable amplifiers.

FIGS. 1A-B show gain amplifiers. In FIG. 1A, amplifier 10 compares voltages on its inverting (−) and non-inverting (+) inputs to drive an output VOUT. Feedback resistor 14 is connected between VOUT and the inverting input. The non-inverting (+) inputs to amplifier 10 is grounded. Series resistor 12 is connected between input VIN and the inverting input at node VS. The output voltage VOUT is equal to VIN multiplied by −1*RF/RS, where RF is the resistance value of feedback resistor 14 and RS is the resistance value of series resistor 12. This circuit configuration is inverting, since the polarity of changes in VIN are inverted to VOUT. The gain or amplification can be set to a desired value by selecting values of RS and RF.

In FIG. 1B, VIN is applied directly to the non-inverting (+) input to amplifier 10. Series resistor 12 is connected between ground and the inverting input at node VS. The output voltage VOUT is equal to VIN multiplied by [1+(RF/RS)]. This circuit configuration is non-inverting, since the polarity of changes in VIN are not inverted to VOUT. Amplifier 10 adjusts VOUT until its inputs VS and VIN are equal in voltage. Selecting values of RS and RF allow a desired gain to be achieved.

Systems with automatic gain control or gain compensation may use a variable-gain amplifier. The gain of the amplifier is changed during operation, such as by stepping up the gain in increments until an output is within a desired range. Each change in an input signal can result in the gain being stepped up or down to compensate.

The gain can be adjusted by changing the resistance values RS or RF. FIG. 2 shows a programmable gain amplifier circuit that has selectable resistors in parallel on the input. Input VIN is buffered by driver 16 to drive one terminal of each of series resistors 22. Switches 20 are transmission gates that connect the other terminal of one or more of series resistors 22 to node VS, the inverting input of amplifier 10. The non-inverting input is grounded. Feedback resistor 14 is connected between VS and VOUT.

The gain is −RS/RF, where RS is now variable and depends on which of series resistors 22 are connected by switches 20. As more of series resistors 22, or lower resistance values of series resistors 22 are selected by switches 20, RS decreases and the magnitude of the gain increases.

FIG. 3 is a table of resistor values to produce logarithmic gain increments. While the resistance values of series resistors 22 (FIG. 2) could be set to the same value, the increments of overall RS achieved would not be logarithmic. Specific values of series resistors 22 are needed to provide logarithmic increments in RS and gain. A three-bit control word CTRL can control 8 switches 20 to select from among 8 series resistors 22. Each of the 8 series resistors 22 has a different resistance value, as shown in the last column of the table.

The gain increases by 2 Decibels for each increment in control word CTRL. However, the linear gain values 1.00, 1.259, 1.585, 1.995, . . . require precise resistor values for series resistors 22 of 10, 7.943, 6.31, 5.102, . . . Kohm when feedback resistor 14 has a 10-Kohm value.

Each of the eight values of series resistors 22 is different and must be precisely matched to each other and to the 10-Kohm value of feedback resistor 14. There are no common factors or ratios to simplify this resistor-matching problem. A total of 9 resistors, all with different values, must be precisely matched to achieve precise logarithmic steps.

Resistor matching is sometimes achieved by careful placement and layout of resistors on an Integrated Circuit (IC). Such careful layout is difficult and potentially expensive. Slight offsets of lithographic equipment may add resistances in one direction and not in another, such as when contacts are mis-aligned to a substrate resistor diffusion.

As the number of logarithmic steps increases, so does the number of resistors that have to be matched to one another. The number of resistor ratios than need to be matched is proportional to $2^N$, where N is the number of bits in control word CTRL. Thus scaling the variable-gain amplifier of FIG. 2 to greater programmability is problematic due to this resistor-matching problem.

FIG. 4 shows a variable-gain amplifier circuits using series resistors 22 in series. Buffer 16 buffers VIN and drives the first of a series of series resistors 22 in a chain of series resistors 22 to the inverting input of amplifier 10. Switches 20 close to bypass one or more of series resistors 22, reducing the overall resistance RS and thus increasing the gain's magnitude.

This series arrangement of series resistors 22 also suffers from the resistor-ratio matching problem, since there are no common factors in the resistance values of FIG. 3, so 10 resistors need to be matched for a 3-bit control word CTRL.

The series arrangement also suffers from another problem caused by switches 20. In the parallel arrangement of FIG. 2, node VS is driven to ground by amplifier 10. Thus one terminal of each of switches 10 is connected to a virtual ground. However, in the series arrangement of FIG. 4, the terminals of most of switches 10 are at voltages that are not virtual ground. The magnitudes of the threshold voltages of MOS transistors increase when their sources are floating. The larger thresholds can turn off the MOS transistors, or cause the transistors to operate in the saturated region rather than in the linear region.

FIGS. 5A-B highlight the MOS transistor switch problem at low power-supply voltages. In FIG. 5A, the power supply voltage VDD is larger than the sum of the n-channel MOS transistor threshold voltage Vtn and the absolute value of the p-channel MOS transistor threshold voltage |Vtp|.

In FIG. 5B, VDD has a lower value so that VDD is less than Vtn+|Vtp|. A transmission gate switch such as switches 20 cannot always fully open and fully close to select and isolate series resistors 22. Current leakage can occur when switches 20 should be turned off. Power-supply voltages of 3.3 volts to as low as 1.0 volt are needed for more advanced semiconductor processes that use very short gate lengths, such as 350 nm to as low as 40 nm.

What is desired is a Programmable-Gain Amplifier (PGA) that has logarithmic steps. A PGA with logarithmic-in-Decibel steps is desired that can be used for either inverting or non-inverting configurations. A PGA that avoids both the resistor-matching problem and the MOS transistor switch problem is desired. A PGA that uses only a few resistor values yet has many programmable steps is desired. A logarithmic-in-dB PGA using only 3 resistor values for 8 or more logarithmic steps with MOS switches that are connected to a virtual ground is desired. A differential PGA is also desired with many logarithmic steps and few resistance values to match, and without floating MOS switches.

BRIEF DESCRIPTION OF THE DRAWINGS

FIG. 3 is a table of resistor values to produce logarithmic gain increments.

FIG. 4 shows a variable-gain amplifier circuits using series resistors in series.

FIGS. 5A, 5B highlight the MOS transistor switch problem at low power-supply voltages.

FIGS. 7-10 highlight Recursive Current Division (RCD) in the resistor network of FIG. 6.

DETAILED DESCRIPTION

The present invention relates to an improvement in Programmable-Gain Amplifiers (PGA's). The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 6:
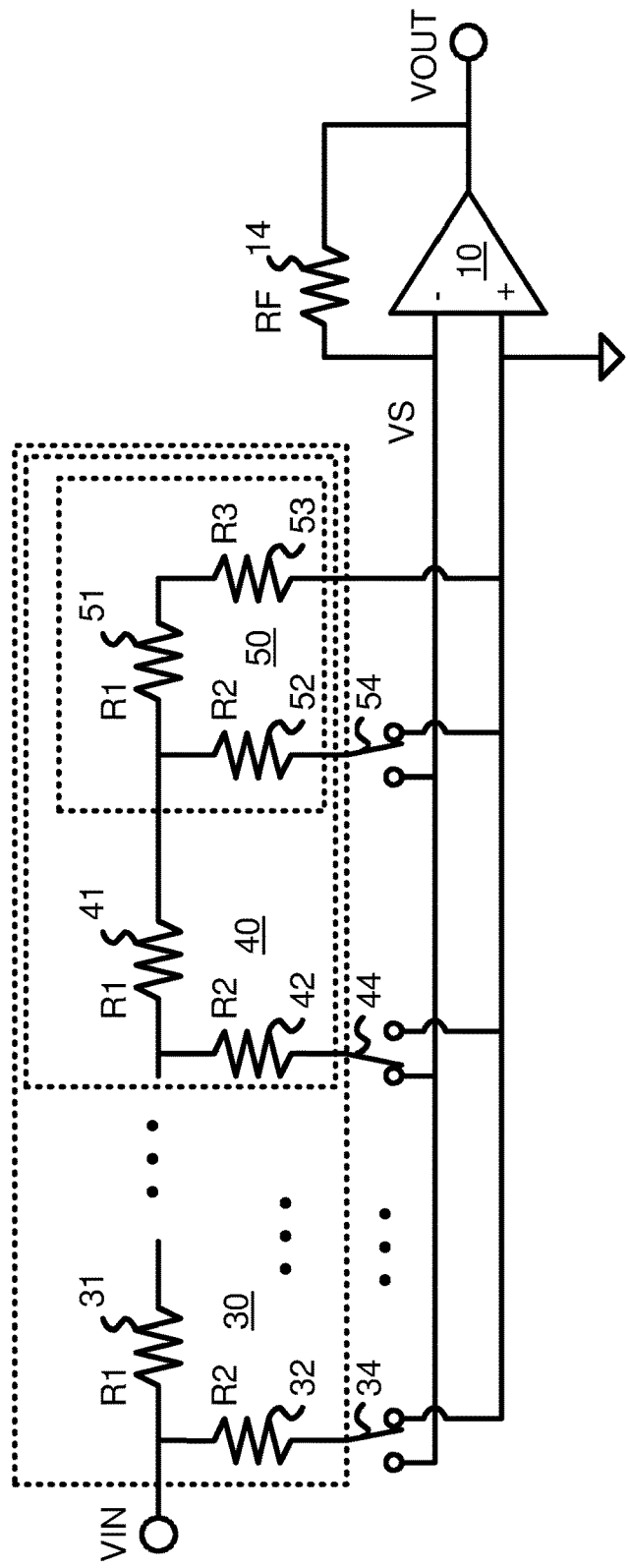
FIG. 6 is a block diagram of a linear-in-dB Programmable-Gain Amplifier (PGA) using recursive current division.

FIG. 6 is a block diagram of a linear-in-dB Programmable-Gain Amplifier (PGA) using recursive current division. Amplifier 10 has feedback resistor 14 between output VOUT and its inverting (−) input, summing node VS. The non-inverting (+) input to amplifier 10 is grounded.

The gain is programmable because switches 34, 44, 54 select one output from resistor network 30 to apply to summing node VS and to amplifier 10. Thus the value of RS is programmable. Switches 34, 44, 54 are connected to ground or to node VS. Node VS is driven to ground by amplifier 10 comparing ground to VS, so node VS is a virtual ground. Thus switches 34, 44, 54 have one terminal connected to ground or to a virtual ground. The floating switch problem is avoided. Very low VDD power supplies may be used.

Resistor network 30 many have many resistors, but has only 3 resistor values: R1, R2, and R3. Thus resistor matching is not problematic, since only 3 resistor values are used. As the number of logarithmic steps increases, and more switches 44 and more resistor cells of resistors 41, 42 are inserted, still only 3 resistance values are used. Thus resistor network 30 can scale up to a large network yet only require matching 3 values of resistance.

R1 resistors 31, 41, 51 have a resistance value of R1. R2 resistors 32, 42, 52 have a resistance value of R2. R3 resistor 53 has a resistance value of R3. Additional cells are added by adding one R1 resistor between adjacent R1 resistors, and adding one R2 resistor between the new node between the R1 resistors and a new switch that switches the lower terminal of the new R2 resistor to either VS or to ground.

The values of R1, R2, and R3 are chosen so that the ratio of currents through adjacent cell's R2 resistors 32, 42, 52 remain a constant ratio for all cells in resistor network 30. Thus each successive switch 54, 44, 34 selects currents that increment by the same ratio. This constant ratio of currents produces a linear-in-Decibels increment of currents into summing node VS, and a linear-in-Decibels increment of gain.

Since switch 34 is separated from input VIN by only one R2 resistor 32, the current selected by switch 34 is the largest current. The largest current has the smallest equivalent resistance and produces the largest magnitude gain. Switch 54 is separated from VIN by R2 resistor 52 and R1 resistors 31, . . . 41, switch 54 selects the smallest current and the smallest magnitude gain. Intermediate currents and intermediate gains are selected by selecting intermediate switches 44. Only one of switches 34, 44, 54 is selected to connect to summing node VS while the other of switches 34, 44, 54 connect to ground. R3 resistor 53 also connects to ground.

The R3 value of R3 resistor 53 is set equal to the equivalent resistance of R2 resistor 52 in parallel with the series connection of R1 resistor 51 and R3 resistor 53:

$$R3 = R2 \| R1 + R3$$

The R3 value of R3 resistor 53 is selected to be equal to the equivalent resistance of all three resistors 51, 52, 53 in final cell 50. This choice for R3 causes Recursive Current Division (RCD) to be performed by resistor network 30. The currents from successive ones of switches 54, 44, 34 have constant ratios of increments, producing linear-in-dB increments to gain.

Figure 7:
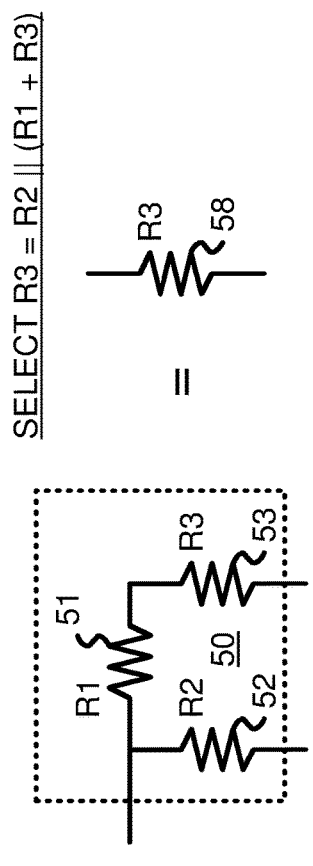

FIGS. 7-10 highlight Recursive Current Division (RCD) in the resistor network of FIG. 6. In FIG. 7, final cell 50 of FIG. 6 has 3 resistors. R2 resistor 52 is in parallel with the series connection of R1 resistor 51 and R3 resistor 53.

Rather than selecting arbitrary values of R1, R2, and R3, the value of R3 is specially chosen. The R3 value of R3 resistor 53 is set equal to the equivalent resistance of R2 resistor 52 in parallel with the series connection of R1 resistor 51 and R3 resistor 53:

$R3 = R2 \| R1 + R3$ or $1/R3 = 1/R2 + 1/(R1+R3)$ $R3 = [R2*(R1+R3)]/(R2+R1+R3)$

This becomes a quadratic equation:

$R3^2 + R3*R1 - R1*R2 = 0$

The solution for R3 is:

$R3 = [-R1 + \text{sqrt}(R1^2 + 4*R1*R2)]/2$

Another solution is rejected since it gives a negative value for resistance R3.

Thus the R3 value of R3 resistor 53 is selected to be equal to the equivalent resistance of all three resistors 51, 52, 53 in final cell 50. Equivalent R3 resistor 58 for final cell 50 has the same resistance value as R2 resistor 52 in parallel with the series connection of R1 resistor 51 and R3 resistor 53.

Figure 8:
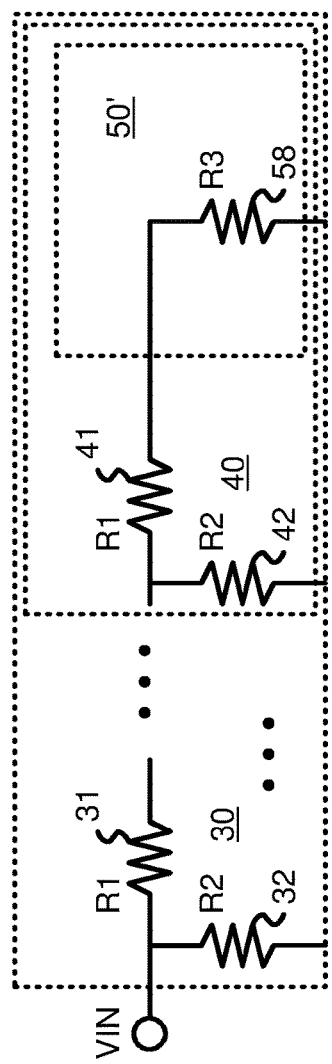

In FIG. 8, since the equivalent resistance of all 3 resistors 51, 52, 53 in final cell 50 is R3, equivalent R3 resistor 58 can be substituted for final cell 50. Intermediate cell 40, with equivalent R3 resistor 58 in final cell 50', now has the same arrangement of three resistors R1, R2, R3 as does original final cell 50 (FIG. 7). R2 resistor 42 is in parallel with the series connection of R1 resistor 41 and equivalent R3 resistor 58. Thus the three resistors 41, 42, 58 in intermediate cell 40 can be substituted with equivalent R3 resistor 58.

FIG. 9 shows equivalent intermediate cell 40' having equivalent R3 resistor 58. Again, the same arrangement of R2 resistor 32 in parallel with the series connection of R1 resistor 31 and equivalent R3 resistor 58 is present. Since R2 ∥ (R1+R3) is equal to R3, the three resistors 31, 32, 58 of the first cell of resistor network 30 can be replaced by equivalent R3 resistor 58. FIG. 10 shows equivalent resistor network 30' with equivalent R3 resistor 58.

Thus each cell 40, 50 in resistor network 30 is recursively replaced with equivalent R3 resistor 58 during circuit analysis. The first current selected by switch 34 is divided by (R1+R2+R3)/R2, or multiplied by R2/(R1+R2+R3), to obtain the second current selected by switch 44. The second current selected by switch 44 is divided by (R1+R2+R3)/R2, or multiplied by R2/(R1+R2+R3), to obtain the third current selected by switch 54. The current of the Nth switch from the left is proportional to:

$[R2/(R1+R2+R3)]^N$

As more resistor cells are added by adding more R1 resistors 41, R2 resistors 42, and switches 44, the value of N increases, but there are still only 3 resistor values R1, R2, R3 that need to be matched. Thus resistor network 30 can be scaled up to larger numbers of switches and selectable currents without increasing the number of resistance values to match.

Figure 11:
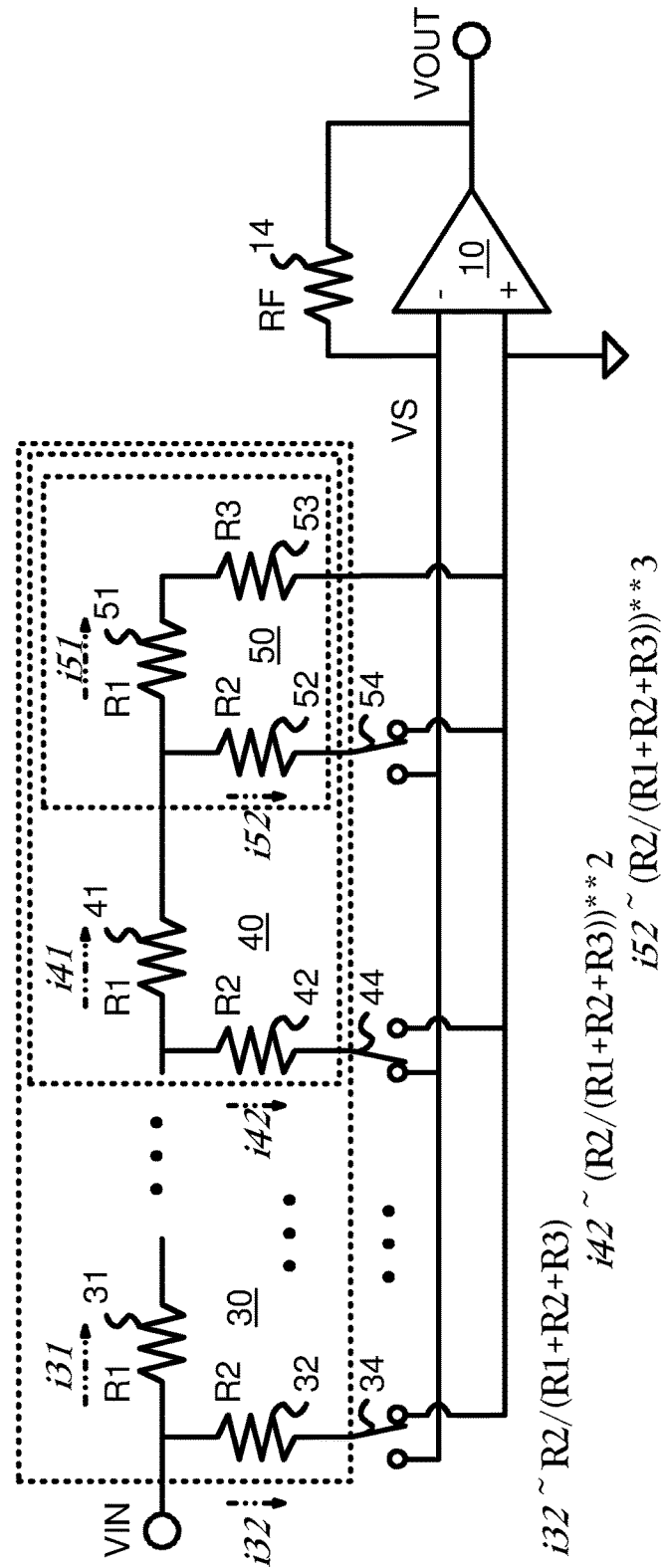
FIG. 11 shows constant current ratios between cells in the resistor network.

FIG. 11 shows constant current ratios between cells in the resistor network. Recursive current division is performed by resistor network 30. The largest current, current i32 through R2 resistor 32 that can be selected by switch 34, is proportional to R2/(R1+R2+R3). The intermediate current, current i42 through R2 resistor 42 that can be selected by switch 44, is proportional to $[R2/(R1+R2+R3)]^2$. The third current, current i52 through R2 resistor 52 that can be selected by switch 54, is proportional to $[R2/(R1+R2+R3)]^3$.

When additional resistor cells such as intermediate cell 40 are inserted, then the Nth cell has a current proportional to $[R2/(R1+R2+R3)]^N$.

The ratio of adjacent currents is constant. For example, the ratio i32/i42 is R2/(R1+R2+R3). Likewise, the ration i42/i52 is also R2/(R1+R2+R3). By selecting only one of the R2 currents from switches 34, 44, 54 to connect to summing node VS, and by connecting R2 currents for the other switches to ground, a PGA with linear-in-dB programming steps is achieved.

The programming step X, in Decibels, is:

$R2/(R1+R2+R3) = 10^{(-X/20)}$

Figure 12:
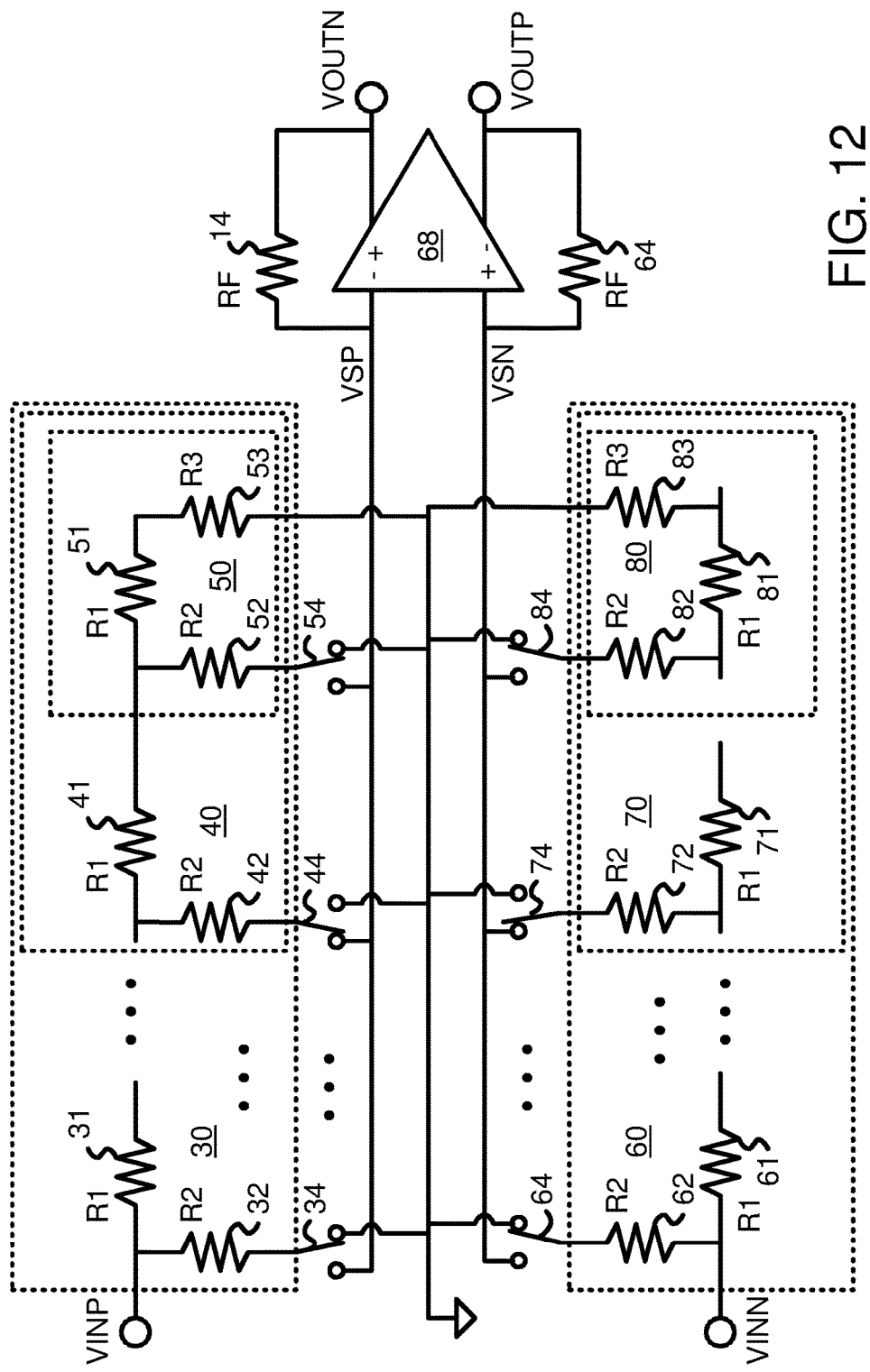
FIG. 12 shows a fully differential PGA using a Recursive Current Division (RCD) resistor network and switches to virtual or actual ground.

FIG. 12 shows a fully differential PGA using a Recursive Current Division (RCD) resistor network and switches to virtual or actual ground. Input VINP is applied to resistor network 30, which has switches 34, 44, 54 to connect to summing node VSP to the inverting input (−) of differential amplifier 68. Feedback resistor 14 feeds output VOUTN to summing node VSP.

A second resistor network 60 that is equivalent to resistor network 30 receives input VINN and has switches 64, 74, 84 that connect currents through R2 resistors 62, 72, 82 to second summing node VSN. Second summing node VSP connects to the non-inverting input (+) of differential amplifier 68. Feedback resistor 64 feeds output VOUTP to summing node VSN.

R1 resistors 61, 71, 81 have the same R1 resistance as do R1 resistors 31, 41, 51 and operate in the same manner. Likewise, R3 resistor 83 in final cell 80 can be replaced with equivalent R3 resistor 58 so that intermediate cell 70 has the same R2 in parallel with R1+R3 during circuit analysis.

Only one pair of switches is enabled while the others are disabled to connect the R2 currents to ground. When switches 34, 64 are enabled, the largest currents flow into summing nodes VSP, VSN, while other switches 44, 54, 74, 84 shunt their R2 currents to ground. When switches 44, 74 are enabled, the intermediate currents flow into summing nodes VSP, VSN, while other switches 34, 54, 64, 84 shunt their R2 currents to ground. When final switches 54, 84 are enabled, the smallest currents flow into summing nodes VSP, VSN, while other switches 34, 44, 64, 74 shunt their R2 currents to ground.

When a differential signal is applied to differential inputs VINN, VINP, and only one pair of switches is selected, differential amplifier 68 has a gain that is determined by the currents selected by switches 34, 44, 54, 64, 74, 84 from resistor networks 30, 60. The gain can be inverting or non-inverting. A better signal-to-noise ratio can be achieved when differential signals are used compared with the use of single-ended signals.

Figure 13:
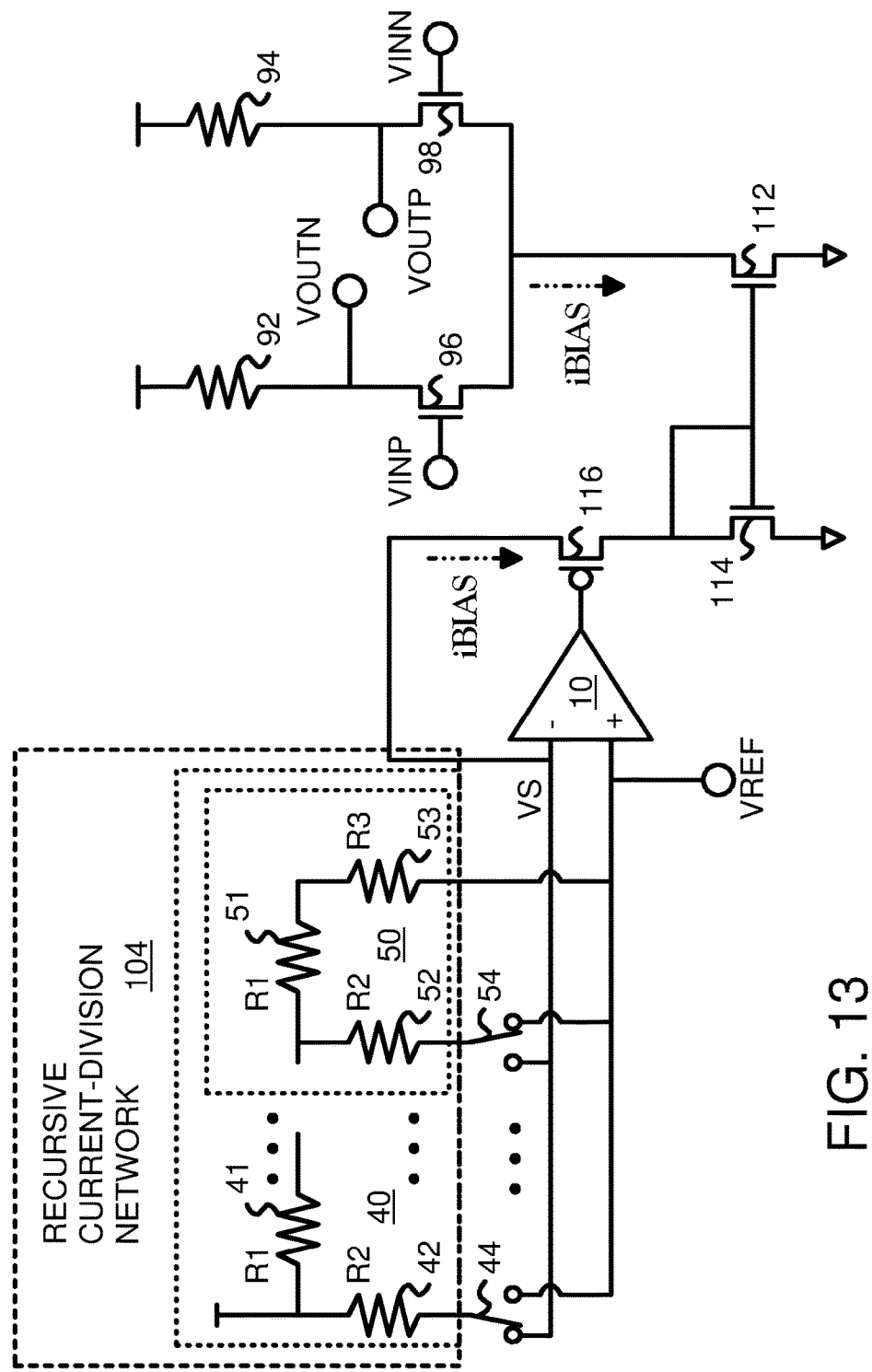
FIG. 13 shows a Recursive Current Division (RCD) resistor network used with a current-mirror amplifier for an open-loop PGA.

FIG. 13 shows a Recursive Current Division (RCD) resistor network used with a current-mirror amplifier for an open-loop PGA. FIGS. 6-12 showed closed-loop amplifiers. Open-loop amplifiers are desirable for some applications.

Resistor network 104 is similar to resistor network 30 of FIG. 6, driving selectable currents to summing node VS to amplifier 10. The non-inverting (+) input to amplifier 10 is connected to a reference voltage VREF.

VREF may be selected in a region which PMOS will turn on so that switches 44, 54 do not suffer from the floating switch issue. The value of VREF chosen depends on the desired iBIAS. Maximum iBIAS=(VDD−VREF)/R2

The output of amplifier 10 drives the gate of p-channel transistor 116 to control bias current iBias through its channel from summing node VS to n-channel transistor 114. The bias current through n-channel transistor 114 creates a drain voltage that is applied to its gate and to the gate of current-mirror transistor 112. Thus the iBias current is mirrored to transistor 112, with the mirrored current depending on the ratio of transistors 112, 114.

Differential inputs VINP, VINN are applied to the gates of differential n-channel transistors 96, 98, which draw current through resistors 92, 94. The sources of differential n-channel transistors 96, 98 are connected together and to the drain of current-mirror transistor 112.

The tail current iBias in the differential amplifier stage can be controlled by selecting a current from resistor network 104. The currents are selectable in logarithmic steps as described for resistor network 30. Thus the selected current is linear-in-dB, and the bias current iBias is also linear-in-dB. A linear-in-dB gain can be achieved since the gain of the differential amplifier stage is proportional to the square root of iBias.

Alternate Embodiments

Several other embodiments are contemplated by the inventors. For example the smallest current from R3 resistor 53 may be permanently connected to node VS or to the ground node, or a switch may be used and switched the same as switch 54 when the smallest current is negligible. A pre-set current could be provided for the first or last programmable settings in addition to the logarithmic steps that may be selected.

Additional components may be added at various nodes for various purposes, such as cut-off switches for power-down modes, voltage shifters, offset currents to set A.C. operating points, etc. The differential amplifier of FIG. 13 may be inverted, swapping n-channel for p-channel transistors and power for ground. Various reference voltages or virtual supplies may be used rather than a hard ground. The differential amplifier of FIG. 12 may be used for a single-ended non-inverting application where VINP is grounded, VIN is applied to VINN, and the output is taken from VOUTN while VOUTP is ignored.

The example shown in the table of FIG. 3 can be achieved by selecting RF to be 10 k-Ohm, R1 to be 106 Ohms, R2 to be 1995 Ohm, and R3 to be 410 Ohms. Multiples of these resistance values may be used, such as 212, 3990, and 820 Ohms for R1, R2, R3.

Resistor values may be rounded or approximations used. For this example, R1 could be rounded to 100 Ohm, R2 rounded to 2K-Ohm, and R3 rounded to 400 Ohms. When exact logarithmic behavior is not critical, resistor values may be more widely approximated. Resistor values within +/−5% may be used for critical applications, +/−10% for average applications, and +/−20% for inexpensive applications such as consumer toys.

Figure 1:
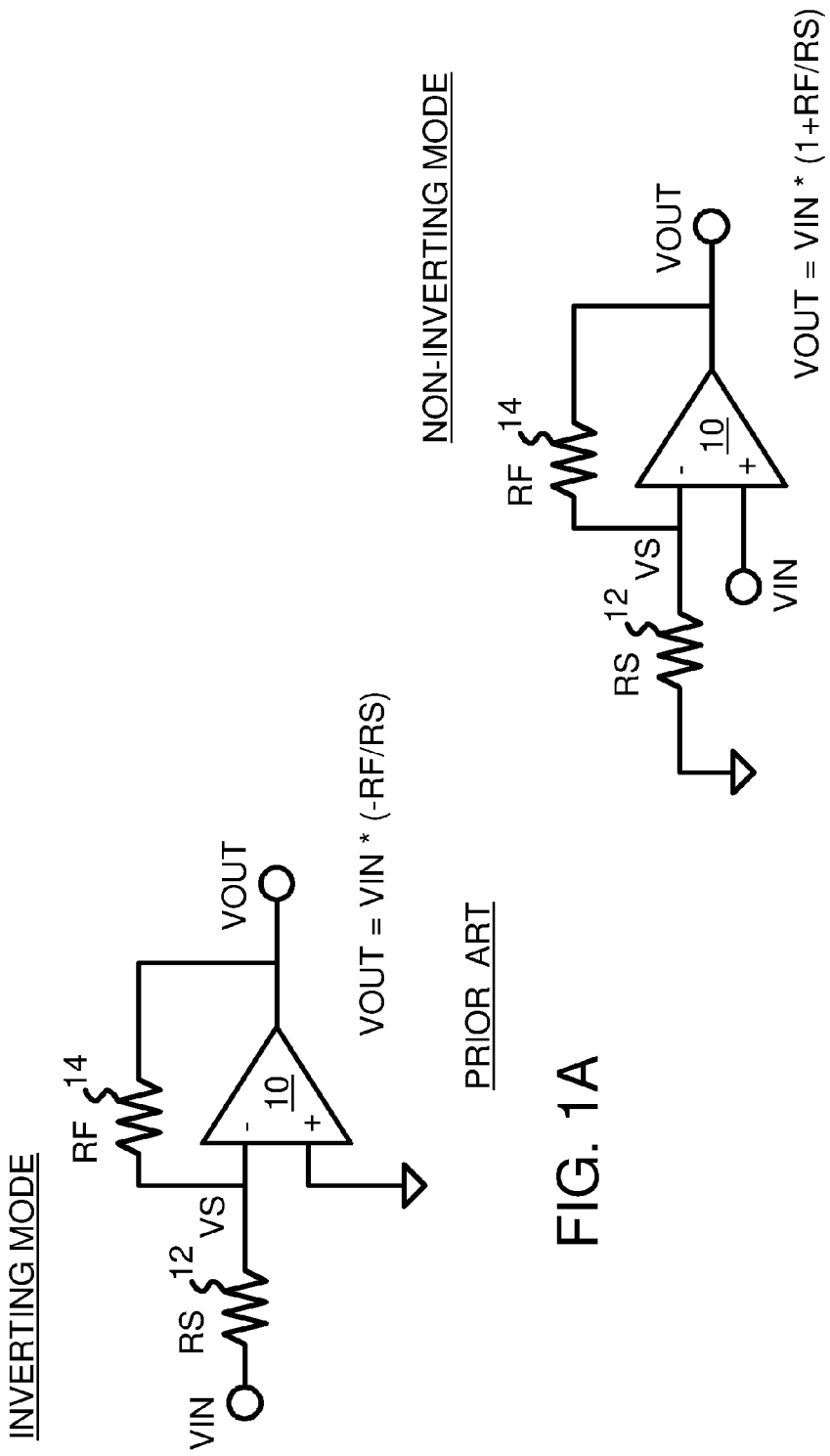
FIGS. 1A, 1B show gain amplifiers.
Figure 2:
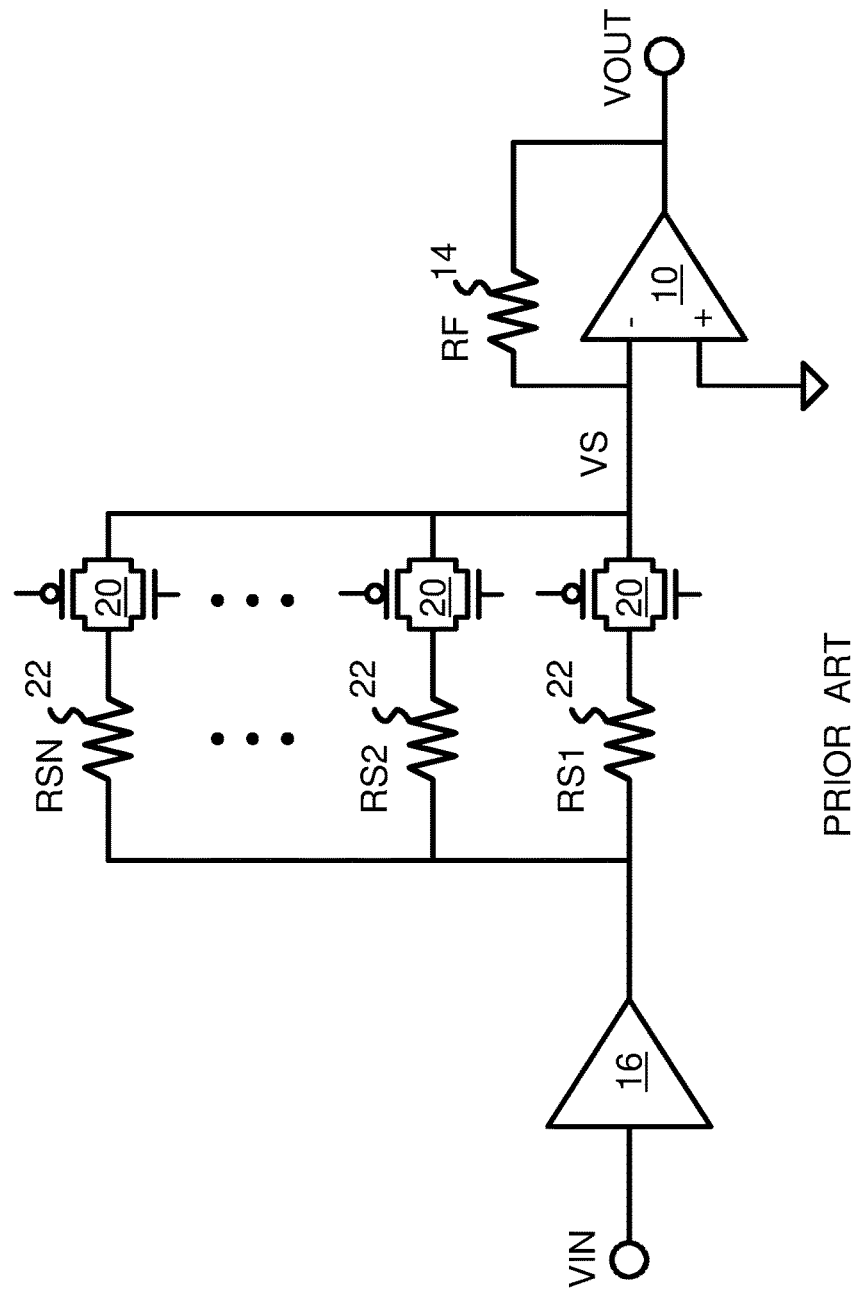
FIG. 2 shows a programmable gain amplifier circuit that has selectable resistors in parallel on the input.

Switches 34, 44, 54 each may be implemented as a pair of transmission gates, or as a pair of n-channel pass transistors. For example, switches 34, 44, 54 may each be implemented as a n-channel and a p-channel transistor in parallel as shown for switches 20 in FIGS. 2, 4. While only one of the switches is selected to connect to the summing node VS, other embodiments could select two or more of the switches for connecting to VS for more complex increments than the logarithmic increments, or for intermediate steps between the logarithmic steps.

The locations of R1 resistor 51 and R3 resistor 53 could be swapped, so that R1 resistor 51 connects to VS while R3 resistor 53 is connected between R1 resistor 51 and the upper terminal of R2 resistor 52. The series connection remains regardless of the order or sequence of R1 resistor 51 and R3 resistor 53.

Feedback resistor 14 could also be programmable, such as for a coarse gain selection while resistor network 30 provides a fine gain selection. Other currents from other resistor networks could be added that can be selected onto the summing node VS. These other currents could be selected when non-logarithmic steps in gain are desired. For example, an amplifier circuit could use resistor network 30 when logarithmic steps are desired, and use another resistor network when linear programming steps are desired. Only one of these networks could be used at a time. Alternatively, both logarithmic and linear networks could be used at the same time. An offset current could be summed into summing node VS to provide a gain offset before the currents from resistor network 30 are selected to provide logarithmic gain steps.

The current sources, such as resistors 92, 94 of FIG. 13, could be implemented as n-channel or p-channel transistors having gates receiving a fixed voltage. Fixed voltages or bias voltages could be generated by bias generators such as a resistor divider or a series of transistors.

Rather than have feedback transistor connect directly to the summing node VS, a bias current from a fixed current source could supply iBias, which is then controlled by transistor 116.

Various theories of operation have been presented to try to explain operation. These theories are approximations of real, often complex, physical behaviors. These theories may be incorrect, although useful for designing circuits. The invention is not limited by these theories and does not depend on these theories being correct.

The circuit designer may choose resistors, capacitors, transistors, and other components to have a ratio that produces the desired voltages and currents. While Complementary-Metal-Oxide-Semiconductor (CMOS) transistors have been described, other transistor technologies and variations may be substituted, and materials other than silicon may be used, such as Galium-Arsenide (GaAs) and other variations. DMOS, LDMOS, and diffusion-enhanced transistors may be used. Bipolar transistors could also be used.

Timings may be adjusted by adding delay lines or by controlling delays in leading-edge blocking units. Pulse generators could also be added. The outputs or control signals may be swapped to add an inversion. Inverting and non-inverting inputs may be swapped and the polarity of the output reversed.

Separate power supplies and grounds may be used for some components. The bulk or substrate nodes of transistors or under diffusion resistors may be tied to power for p-channel transistors, and to ground for n-channel transistors, or a substrate bias generate be used to generate bulk voltages. Various filters could be added. Active low rather than active high signals may be substituted. The signals applied to the gates of p-channel and n-channel transistors may be switched to power or ground to power down the circuit.

Bias voltages may be fixed, or may be adjustable, such as to track temperature, process, or power-supply voltage. Band-gap references may be used.

While positive currents have been described, currents may be negative or positive, as electrons or holes may be considered the carrier in some cases. Source and sink currents may be interchangeable terms when referring to carriers of opposite polarity. Currents may flow in the reverse direction.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation.

Inversions may be added, or extra buffering. The final sizes of resistors, transistors, or capacitors may be selected after circuit simulation or field testing. Metal-mask options or other programmable components may be used to select the final capacitor, resistor, or transistor sizes.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A Programmable-Gain Amplifier (PGA) comprising:
an amplifier having a first input and a second input and driving an output;
a feedback resistor coupled between the first input and the output;
a resistor network having an input receiving an input signal, and having a plurality of selectable outputs;
a plurality of switches that connect the plurality of selectable outputs from the resistor network to the first input of the amplifier;
a final cell in the resistor network, the final cell having a first resistor in series with a third resistor, and having a second resistor between a cell input and a selectable output in the plurality of selectable outputs selected by the plurality of switches, the cell input also connecting to the first resistor in series with the third resistor;
a plurality of intermediate cells in the resistor network, each intermediate cell having a cell input, a selectable output in the plurality of selectable outputs, and a connecting output, each intermediate cell having a first resistor connected between the cell input and the connecting output, and a second resistor connected between the cell input and the selectable output;
wherein the connecting output of a prior cell in the plurality of intermediate cells connects to the cell input of a next cell in the plurality of intermediate cells;
a first cell in the plurality of intermediate cells that has a cell input receiving the input signal;
a last cell in the plurality of intermediate cells that has a connecting output that connects to the cell input of the final cell;
wherein the first resistors each has a first resistance value, the second resistors each has a second resistance value, and the third resistor has a third resistance value, wherein the resistor network has only three resistance values;
wherein the third resistance value is equal within 10% to an equivalent resistance of the second resistance value in parallel with a series of the first resistance value and the third resistance value;
wherein a current selected by a switch for a cell N in the plurality of cells is proportional within 10% to $[R2/(R1+R2+R3)]^N$, wherein R2 is the second resistance value, R1 is the first resistance value, R3 is the third resistance value, and N is a whole number, where N is a number of cells between a first cell in the plurality of cells and cell N, including both the first cell and cell N;
a feedback transistor having a gate receiving the output of the amplifier, for controlling a current from the first input of the amplifier to generate a bias current;
a first current mirror transistor that receives the bias current from the feedback transistor, and has a gate and a drain connected together as a current-mirror node;
a second current-mirror transistor having a gate receiving the current-mirror node;
a first differential transistor having a gate receiving the input signal, and having a drain connected to the second current-mirror transistor; and
a second differential transistor having a gate receiving an inverse of the input signal, and having a drain connected to the second current-mirror transistor.

2. The PGA of claim 1 wherein the second input of the amplifier is connected to a ground.

3. The PGA of claim 2 wherein only one of the plurality of switches is selected to connect to the first input of the amplifier to set a gain of the amplifier, wherein other switches in the plurality of switches are connected to the second input of the amplifier when not selected.

4. The PGA of claim 3 wherein the third resistance value is equal within 5% to an equivalent resistance of the second resistance value in parallel with a series of the first resistance value and the third resistance value.

5. The PGA of claim 3 wherein the third resistance value is equal within 1% to an equivalent resistance of the second resistance value in parallel with a series of the first resistance value and the third resistance value.

6. The PGA of claim 1 wherein the first resistance value is 106 Ohms +/−10%, the second resistance value is 1995 Ohms +/−10%, and the third resistance value is 410 Ohms +/−10%.

7. The PGA of claim 1 wherein a ratio of the first resistance value to the second resistance value to the third resistance value is within +/−10% of 106:1995:410.

8. The PGA of claim 1 wherein the plurality of switches are transistor switches each having one terminal connected to ground or to a virtual ground.

9. The PGA of claim 1 wherein the first input of the amplifier is an inverting input and the second input of the amplifier is a non-inverting input.

10. A Programmable-Gain Amplifier (PGA) using Recursive Current Division (RCD) comprising:
an amplifier having a first input and a second input and an output generated in response to a difference between the first input and the second input;
a feedback resistor coupled between the first input and the output of the amplifier;
a resistor network that comprises:
a final cell having:
a final second resistor connected between a final cell input and a final cell selectable output;
a final switch that connects a current from the final second resistor to the first input when the final switch is selected, and connects a current from the final second resistor to a ground when the final switch is not selected;
a final branch connected between the final cell input and the ground, the final branch having a final first resistor in series with a third resistor;
a plurality of cells each comprising:
a second resistor connected between a cell input and a cell selectable output;
a switch that connects a current from the second resistor to the first input when the switch is selected, and connects a current from the second resistor to the ground when the switch is not selected; and
a first resistor connected between the cell input and a cell input of a next cell in the plurality of cells, or to the final cell input for a last cell in the plurality of cells;
wherein a first cell in the plurality of cells receives an input signal as the cell input;
wherein the first resistor and the final first resistor have a first resistance value;
wherein the second resistor and the final second resistor have a second resistance value;
wherein the third resistor has a third resistance value that is equal within 10% to an equivalent resistance of the second resistance value in parallel with a series connection of the first resistance value and the third resistance value;
wherein a current selected by a switch for a cell N in the plurality of cells is proportional within 10% to $[R2/(R1+R2+R3)]^N$, wherein R2 is the second resistance value, R1 is the first resistance value, R3 is the third resistance value, and N is a whole number, where N is a number of cells between a first cell in the plurality of cells and cell N, including both the first cell and cell N;
a feedback transistor having a gate receiving the output of the amplifier, for controlling a current from the first input of the amplifier to generate a bias current;
a first current mirror transistor that receives the bias current from the feedback transistor, and has a gate and a drain connected together as a current-mirror node;
a second current-mirror transistor having a gate receiving the current-mirror node;
a first differential transistor having a gate receiving the input signal, and having a drain connected to the second current-mirror transistor; and
a second differential transistor having a gate receiving an inverse of the input signal, and having a drain connected to the second current-mirror transistor.

11. The PGA using RCD of claim 10 wherein the plurality of cells comprises 7 cells, wherein one current in a plurality of 8 currents is selected by switches from the plurality of cells and from the final cell to the first input of the amplifier.

12. The PGA using RCD of claim 11 wherein intervals between the plurality of 8 currents are logarithmic.

13. The PGA using RCD of claim 10 wherein the amplifier is a differential amplifier and the output is a first output;
further comprising:
a second feedback resistor coupled between the second input and a second output of the amplifier;
a second resistor network that comprises:
a final cell having:
a final second resistor connected between a final cell input and a final cell selectable output;
a final switch that connects a current from the final second resistor to the second input when the final switch is selected, and connects a current from the final second resistor to a ground when the final switch is not selected;
a final branch connected between the final cell input and the ground, the final branch having a final first resistor in series with a third resistor;
a plurality of cells each comprising:
a second resistor connected between a cell input and a cell selectable output;
a switch that connects a current from the second resistor to the second input when the switch is selected, and connects a current from the second resistor to the ground when the switch is not selected;
a first resistor connected between the cell input and a cell input of a next cell in the plurality of cells, or to the final cell input for a last cell in the plurality of cells;
wherein a first cell in the plurality of cells receives a complement input signal as the cell input.

14. A programmable resistor network circuit comprising:
a final cell having:
a final second resistor connected between a final cell input and a final cell selectable output;
a final switch that connects a current from the final second resistor to a summing node when the final switch is selected, and connects a current from the final second resistor to a ground when the final switch is not selected;
a final branch connected between the final cell input and the ground, the final branch having a final first resistor in series with a third resistor;
a plurality of cells each comprising:
a second resistor connected between a cell input and a cell selectable output;
a switch that connects a current from the second resistor to the summing node when the switch is selected, and connects a current from the second resistor to the ground when the switch is not selected;
a first resistor connected between the cell input and a cell input of a next cell in the plurality of cells, or to the final cell input for a last cell in the plurality of cells;
an amplifier that receives the summing node at a first amplifier input, the amplifier driving an amplifier output in response to a voltage difference between the first amplifier input and a second amplifier input;
a feedback transistor having a gate receiving the amplifier output, for controlling a current from the summing node to generate a bias current;

a first current mirror transistor that receives the bias current from the feedback transistor, and has a gate and a drain connected together as a current-mirror node;

a second current-mirror transistor having a gate receiving the current-mirror node;

a first differential transistor having a gate receiving a first input signal, and having a drain connected to the second current-mirror transistor; and a second differential transistor having a gate receiving a second input signal, and having a drain connected to the second current-mirror transistor;

wherein a first cell in the plurality of cells receives an input signal as the cell input;

wherein the first resistor and the final first resistor have a first resistance value;

wherein the second resistor and the final second resistor have a second resistance value;

wherein the third resistor has a third resistance value that is equal within 10% to an equivalent resistance of the second resistance value in parallel with a series connection of the first resistance value and the third resistance value;

wherein a current selected by a switch for a cell N in the plurality of cells is proportional to $[R2/(R1+R2+R3)]^N$, wherein R2 is the second resistance value, R1 is the first resistance value, R3 is the third resistance value, and N is a whole number, where N is a number of cells between a first cell in the plurality of cells and cell N, including both the first cell and cell N.

15. The programmable resistor network circuit of claim 14 further comprising:

an amplifier that receives the summing node at a first amplifier input, the amplifier driving an amplifier output in response to a voltage difference between the first amplifier input and a second amplifier input;

a feedback resistor coupled between the first amplifier input and the amplifier output;

wherein the second amplifier input is connected to the ground.

* * * * *